United States Patent [19]

Lemelson

[11] Patent Number: 5,462,772
[45] Date of Patent: * Oct. 31, 1995

[54] METHODS FOR FORMING ARTIFICIAL DIAMOND

[76] Inventor: Jerome H. Lemelson, Call Box 14-286, Incline Village, Nev. 89450

[*] Notice: The portion of the term of this patent subsequent to Oct. 12, 2006, has been disclaimed.

[21] Appl. No.: 30,506

[22] Filed: May 13, 1993

Related U.S. Application Data

[63] Continuation of Ser. No. 698,090, May 10, 1991, abandoned, which is a continuation-in-part of Ser. No. 372,858, Jun. 29, 1989, Pat. No. 5,021,628, which is a continuation-in-part of Ser. No. 625,197, Jun. 28, 1984, Pat. No. 4,874,596, which is a continuation of Ser. No. 302,644, Sep. 15, 1981, abandoned, which is a continuation-in-part of Ser. No. 110,477, Jan. 8, 1980, abandoned, which is a continuation of Ser. No. 815,692, Jul. 14, 1977, abandoned, which is a continuation of Ser. No. 547,733, Feb. 6, 1975, abandoned, which is a continuation-in-part of Ser. No. 93,779, Nov. 30, 1970, Pat. No. 4,207,154, said Ser. No. 302,644, is a continuation-in-part of Ser. No. 74,388, Sep. 10, 1979, Pat. No. 4,385,880, which is a continuation of Ser. No. 958,514, Nov. 7, 1978, abandoned, and a continuation of Ser. No. 165,445, Jul. 26, 1971, abandoned, which is a continuation of Ser. No. 710,517, Mar. 5, 1968, abandoned, which is a continuation of Ser. No. 501,395, Oct. 22, 1965, Pat. No. 3,371,404.

[51] Int. Cl.$^6$ ........................... B05D 3/06
[52] U.S. Cl. ............... 427/554; 427/181; 427/196; 427/197; 427/201; 427/230; 427/261; 427/284; 427/294; 427/370; 427/376.1; 427/542; 427/551; 427/552; 427/555; 427/557; 427/559; 427/560; 427/596; 427/600
[58] Field of Search ..................... 427/542, 551, 427/552, 554, 555, 556, 557, 559, 560, 596, 600, 196, 197, 204, 376.1, 284, 294, 261, 370, 230, 181

[56] References Cited

U.S. PATENT DOCUMENTS 2,411,867  12/1946  Brenner .................. 428/408
2,793,282   5/1957  Steigerwald .............. 219/69

FOREIGN PATENT DOCUMENTS

| 1061592 | 11/1953 | France . |
| 1240668 | of 1959 | France . |
| 47-44438 | 11/1972 | Japan . |
| 57-106513 | 7/1982 | Japan . |
| 60-195094 | 10/1985 | Japan . |
| 61-106494 | 5/1986 | Japan . |

(List continued on next page.)

OTHER PUBLICATIONS

Nuckolls et al., "Laser–induced thermonuclear fusion," *Physics Today,* pp. 46–53 (Aug. 1973).

Gralnick et al., "Fusion Reactor Fueling," *Transactions of the American Nuclear Society 1977 Annual meeting,* pp. 12–15, (Jun. 12–16, 1977).

Larson, "The Mid–Cretaceous Superplume Episode," *Scientific American,* pp. 82–86 (Feb. 1995).

*Primary Examiner*—Bernard Pianalto
*Attorney, Agent, or Firm*—Steven G. Lisa; Peter C. Warner; Louis J. Hoffman

[57] ABSTRACT

New and improved structures in tools subject to wear and attrition when engaging or engaged by work or material being worked on thereby. Synthetic diamond material is formed in situ on a select portion or portions of the surface of a hard substrate or tool support to define or cover the portion of the tool substrate adjacent the work operated on by the tool in a manner to provide a hard wear resistant work engaging surface or surfaces which offers substantially greater resistance to abrasion and frictional deterioration than the material of the substrate or tool base. In one form, the synthetic diamond material is formed on and welded to the surface of the substrate in a single operation involving the application of intense radiant energy beamed against particles of carbon which are converted to a solid synthetic diamond structure of defined shape directly against the solid substrate. In a particular form, the synthetic diamond material is formed with a cutting edge for the tool having substantially the hardness and wear resistance of diamond.

29 Claims, 1 Drawing Sheet

U.S. PATENT DOCUMENTS

| | | | |
|---|---|---|---|
| 2,861,166 | 11/1958 | Cargill, Jr. | 219/34 |
| 2,947,610 | 8/1960 | Hall | 23/209.1 |
| 2,968,723 | 1/1961 | Steigerwald | 250/49.5 |
| 3,099,083 | 7/1963 | DeLong | 29/527 |
| 3,141,746 | 7/1964 | De Lai | 51/307 |
| 3,207,582 | 9/1965 | Inoue | 23/209.1 |
| 3,306,720 | 2/1967 | Darrow | 51/309 |
| 3,346,458 | 10/1967 | Schmidt | 176/1 |
| 3,361,448 | 1/1968 | Warrington | 285/55 |
| 3,371,404 | 3/1968 | Lemelson | 228/107 |
| 3,378,446 | 4/1968 | Whittlesey | 176/1 |
| 3,396,595 | 8/1968 | Niemann | 74/425 |
| 3,461,197 | 8/1969 | Lemelson | 264/172 |
| 3,489,645 | 1/1970 | Daiber et al. | 176/1 |
| 3,602,209 | 8/1971 | Bocker | 125/11 R |
| 3,702,573 | 11/1972 | Nemeth | 76/101 A |
| 3,714,332 | 1/1973 | Rasquin et al. | 423/446 |
| 3,913,280 | 10/1975 | Hall | 51/307 |
| 3,916,506 | 11/1975 | Wolf | 428/457 |
| 3,959,557 | 5/1976 | Berry | 428/368 |
| 3,967,215 | 6/1976 | Bellak | 331/94.5 R |
| 4,054,426 | 10/1977 | White | 51/309 R |
| 4,074,011 | 2/1978 | Teramae et al. | 428/422 |
| 4,077,164 | 3/1978 | Peterman, Jr. | 51/206 P |
| 4,084,942 | 4/1978 | Villalobos | 51/307 |
| 4,161,436 | 7/1979 | Gould | 204/157.1 R |
| 4,184,380 | 1/1980 | Rivin | 74/461 |
| 4,207,154 | 6/1980 | Lemelson | 204/157.1 S |
| 4,214,037 | 7/1980 | Galasso et al. | 428/367 |
| 4,228,142 | 10/1980 | Holcombe, Jr. et al. | 423/449 |
| 4,324,803 | 4/1982 | Bergmann et al. | 428/472 |
| 4,354,328 | 10/1982 | Ainoura | 51/206.4 |
| 4,363,854 | 12/1982 | Hodes et al. | 428/632 |
| 4,385,880 | 5/1983 | Lemelson | 425/77 |
| 4,475,319 | 10/1984 | Wirz | 51/287 |
| 4,554,208 | 11/1985 | MacIver et al. | 428/332 |
| 4,585,704 | 4/1986 | Hirai et al. | 428/446 |
| 4,594,294 | 6/1986 | Eichen et al. | 428/552 |
| 4,610,577 | 9/1986 | Spensberger | 407/27 |
| 4,663,183 | 5/1987 | Ovshinsky et al. | 427/39 |
| 4,693,231 | 9/1987 | Buschmeier | 125/116 D |
| 4,707,384 | 11/1987 | Schachner et al. | 427/249 |
| 4,725,345 | 2/1988 | Sakamoto et al. | 204/192.31 |
| 4,734,339 | 3/1988 | Schachner et al. | 428/701 |
| 4,764,434 | 8/1988 | Aronsson et al. | 428/565 |
| 4,802,807 | 2/1989 | Offenburger et al. | 411/387 |
| 4,859,493 | 8/1989 | Lemelson | 427/45.1 |
| 4,874,596 | 10/1989 | Lemelson | 423/446 |
| 4,882,138 | 11/1989 | Pinneo | 423/446 |
| 4,920,703 | 5/1990 | Hosoya | 51/287 |
| 4,960,643 | 10/1990 | Lemelson | 428/408 |
| 4,971,602 | 11/1990 | Crawford | 511/293 |
| 4,974,498 | 12/1990 | Lemelson | 92/223 |
| 5,021,628 | 6/1991 | Lemelson | 219/121.6 |
| 5,040,501 | 8/1991 | Lemelson | 123/188 AA |
| 5,067,826 | 11/1991 | Lemelson | 384/492 |
| 5,096,352 | 3/1992 | Lemelson | 411/424 |
| 5,131,941 | 7/1992 | Lemelson | 75/10.19 |

FOREIGN PATENT DOCUMENTS

| | | |
|---|---|---|
| 61-124573 | 6/1986 | Japan . |
| 62-196371 | of 1987 | Japan . |
| 62-72921 | 4/1987 | Japan . |
| 1482526 | of 0000 | United Kingdom . |
| 841387 | of 0000 | United Kingdom . |
| 825026 | of 0000 | United Kingdom . |
| 774052 | of 0000 | United Kingdom . |

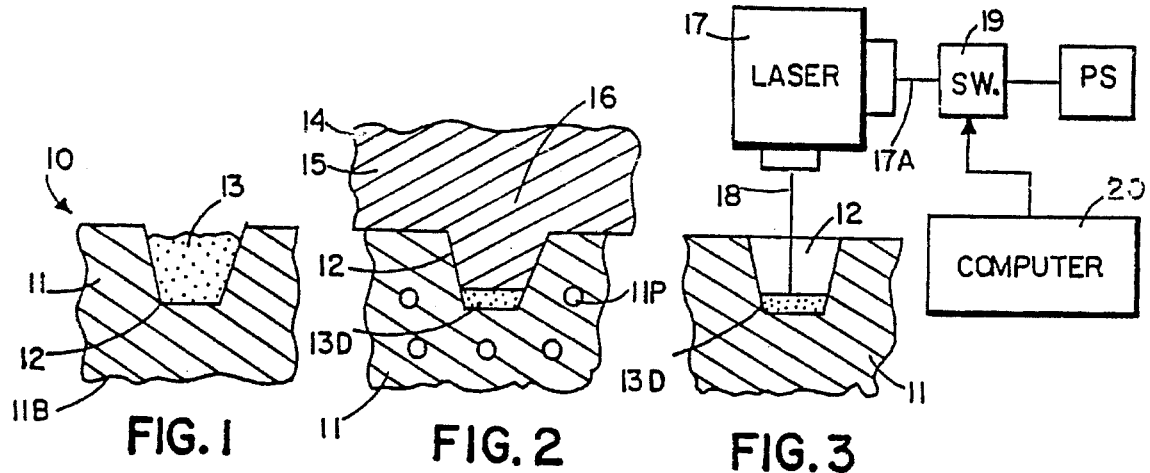
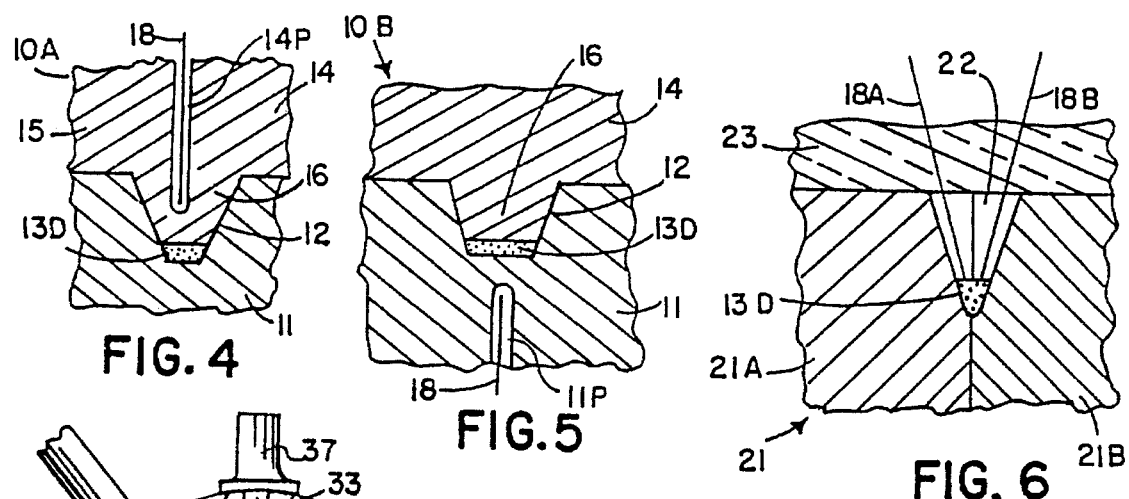
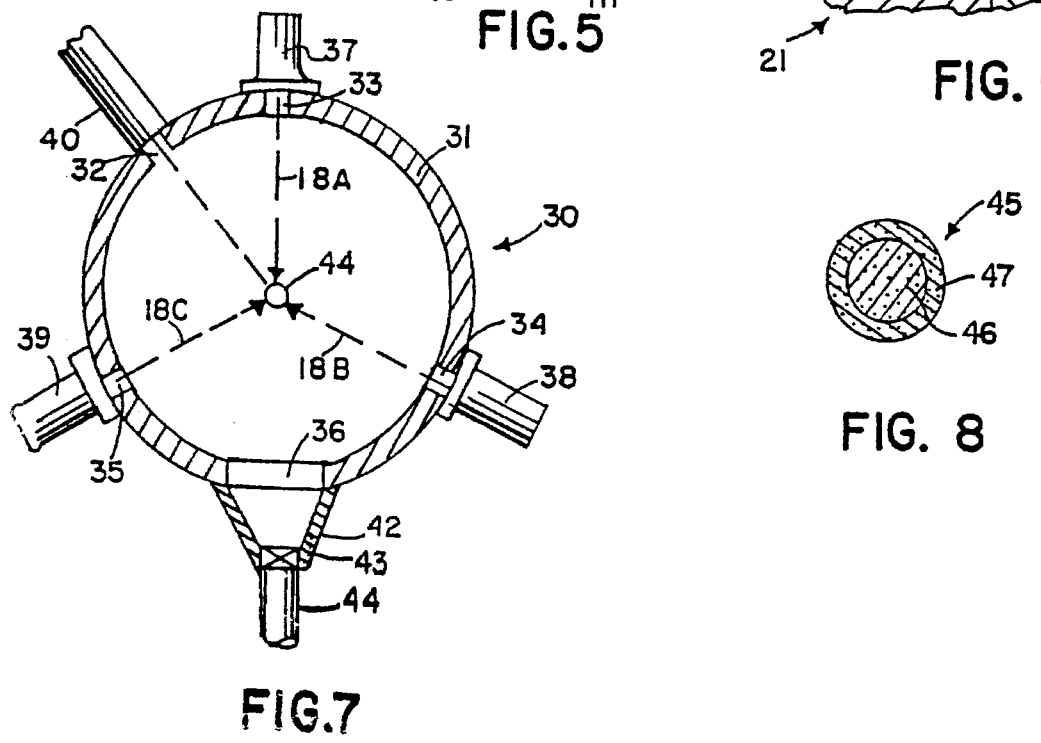

METHODS FOR FORMING ARTIFICIAL DIAMOND

CROSS REFERENCE TO RELATED APPLICATIONS

This is a continuation of Ser. No. 698,090, filed May 10, 1991, abandoned, which is a continuation-in-part of application Ser. No. 07/372,858 filed Jun. 29, 1989, U.S. Pat. No. 5,021,628, as a continuation-in-part of Ser. No. 625,197 filed Jun. 28, 1984 (now U.S. Pat. No. 4,874,596) as a continuation of Ser. No. 302,644 filed Sep. 15, 1981 (abandoned) which was a continuation-in-part of Ser. No. 110,477 (Jan. 8, 1980) (abandoned) which was a continuation of Ser. No. 815,692, Jul. 14, 1977 (abandoned) as a continuation of Ser. No. 547,733, Feb. 6, 1975 (abandoned) as continuation-in-part of Ser. No. 93,779, Nov. 30, 1970, U.S. Pat. No. 4,207,154, said Ser. No. 302,644 is a continuation-in-part of Ser. No. 74,388, Sep. 10, 1979, U.S. Pat. No. 4,385,880 a continuation of Ser. No. 958,514, Nov. 7, 1978 abandoned and Ser. No. 165,445, Jul. 26, 1971 (abandoned) which is a continuation of Ser. No. 710,517, Mar. 5, 1968 (abandoned) which is a continuation of Ser. No. 501,395, Oct. 22, 1965 now U.S. Pat. No. 3,371,401.

BACKGROUND OF THE INVENTION

1. Field of the Invention

This invention is in the field of composite articles of manufacture, such as tools subject to wear and attrition during use. Cutting tools, drawing and forming dies and rolls operable to engage and roll form work come within the categories of the composite articles of manufacture defined by the invention, all of which are subject to high heat and frictional wear during use.

2. The prior Art

The prior art has employed various tool structures and methods to increase their life span and improve their efficiency. Such tool structures have included the use of high strength steels, the provision of tool inserts made of metal carbides and other high strength compounds and alloys and the plating of hard metals such as chromium on the cutting edge portions of tool substrates. However, such material combinations are all subject to high attrition and wear when the tools made thereof are employed to cut or otherwise shape hard metals, ceramics and other hard materials. While natural diamonds have been bonded with adhesives and metal to tool supports, such as cutting tools and dies, they nevertheless suffer shortcomings which limit their life span and use. Tools made of natural diamonds are costly to make and maintain.

U.S. Pat. No. 3,703,766 relates to a cutting tool or blade having a honed sapphire filament bonded to an intermediate layer of glass which is bonded to a substrate. The filament defines the cutting edge of the tool. The structure is costly to produce and maintain. It is not satisfactory for many cutting operation.

U.K. Patent 1,521,841 defines cutting tool with an amorphous alloy defining the cutting edge of the tool.

U.S. Pat. No. 4,015,100 discloses alloyed surface structures of metal which may be used in tool fabrication.

U.S. Pat. No. 3,894,337 teaches the use of a single crystal of alumina having a cutting edge, mounted on a supporting substrate.

SUMMARY OF THE INVENTION

This invention relates to new and improved structures in tools, such as cutting tools and dies, subject to attrition and wear during use wherein such structures are formed with a synthetic diamond portion or layer which is bonded during its formation to the surface of a substrate such as a tool support. The invention is also concerned with methods for producing such tools wherein the synthetic diamond material is formed in situ on and bonded during its formation to the tool base or substrate.

In a preferred form of the invention, a tool such as a cutting tool which is operable to cut hard material, such as metal, metal alloys and hard ceramic materials, is formed of a rigid substrate having a portion thereof shaped to receive and be bonded or welded to a synthetic diamond or diamond-like material which is formed in situ thereagainst. A select portion or portions of the surface of the synthetic diamond material is shaped with a cutting edge or plurality of cutting edges for engaging and cutting work. Synthetic diamond has substantially similar hardness as natural diamond which is the hardest natural material known and the portion of the tool made thereof exhibits superior wear resistance to most other tool structures heretofore made. In addition to providing greatly superior wear resistance during use, the synthetic diamond portion of the composite structure or tool serves to rapidly dissipate and conduct heat to the metal or ceramic supporting substrate of the tool or die at a substantially greater rate and more effectively than conventionally used hard materials such as metal alloys, carbides and ceramic materials used for cutting metal. Furthermore, the bond or weld effected between the synthetic diamond layer and the surface of the substrate, (effected when the former is formed in situ thereon,) provides a heat transfer interface which is superior to that provided when convention diamond is adhered to as a tool support. Accordingly it is a primary object of this invention to provide a new and improved structure in a composite article of manufacture and a method for fabricating same.

Another object is to provide a new and improved composite structure formed of a solid substrate made of metal or hard ceramic material to which is secured a portion or layer of synthetic diamond material.

Another object is to provide a composite article of manufacture formed of a substrate and containing synthetic diamond material as a layer formed in situ against a select portion of the surface of said substrate.

Another object is to provide new and improved structures in devices—such as tools and the like, which are subject to wear during use wherein a select portion or layer thereof is formed of a synthetic diamond or diamond-like material formed of carbon against a surface of a support.

Another object is to provide improved structures in cutting tools such as lathe and milling machine cutting tools, shears, scissors, blades and the like, the cutting edge portions of which are defined by one or more layers of synthetic diamond material having superior wear characteristics and the ability to rapidly conduct frictional heat which may be generated during cutting operations on metal and the like.

Another object is to provide cutting tools for cutting hard materials such as metals and the like which will outlast other cutting tools of similar shape.

Another object of the invention is to provide cutting tools for cutting metals and the like having improved cutting characteristics over conventional cutting tools.

Another object is to provide cutting tools made of diamond or diamond-like material which are relatively lower in cost to produce than similar tools made of natural diamond.

Another object is to provide improved methods for fabricating cutting tools of synthetic diamond.

With the above and such other objects in view as may hereafter more fully appear, the invention consists of the novel constructions, combinations, arrangements of apparatus parts and methods of their operation as will be more fully described and illustrated in the accompanying drawings, but it is to be understood that changes, variations and modifications may be resorted to which fall within the scope of the invention as claimed.

BRIEF DESCRIPTION OF THE DRAWINGS

FIG. 1 is a side cross-sectional view of a portion of a forming member containing a predetermined amount of particles of a material such as carbon, to undergo a reaction in the forming member.

FIG. 2 is a side cross-sectional view of a modified form of the forming member of FIG. 1 with the particles under compression therein by means of a protruding portion of a second forming member which is in forced engagement with the first forming member containing the particles so as to form a high-density pellet of the particles.

FIG. 3 is a side-cross-sectional view of the forming member of FIG. 1 containing the pellet of compressed particles, and a laser directing its intense pulse of radiation into the open forming member and intersecting the pellet.

FIG. 4 is a side cross-sectional view of an assembly of forming elements of the types illustrated in FIG. 2, wherein a passageway extends through one of the forming elements to the protruding portion thereof through which passageway an intense radiation beam is directed.

FIG. 5 is a side cross-sectional view of another assembly of forming elements wherein a forming element containing a cavity has a passageway formed therein through which an intense radiant energy beam is passed to heat and generate a shock wave in the forming member for reacting on matter in the cavity.

FIG. 6 is a side cross-sectional view of another assembly of forming elements containing a cavity in which a pellet of material is reacted on by radiation, which forming elements may be split open or separated to open the cavity and facilitate removal of material, which has been reacted on therefrom.

FIG. 7 is a side cross-sectional view of a reaction chamber of spherical shape in which intense radiation beam effected reactions may be effected with respect to particles or pellets of material such as carbon or other material.

FIG. 8 is a side cross-sectional view of a pellet of material to be reacted on in a reaction chamber of the type shown in FIG. 7 or a modified form thereof.

The instant invention employs intense radiation in the form of one or more beams or a split beam of intense light such as generated by a laser or one or more electron beams generated by a plurality of electron guns, which radiation is made to intersect either a small quantity of a solid material such as carbon or other material, or a form or substrate containing such material in a manner to intensely heat same in such a short period of time as to generate one or more shock waves in such material or form and direct same through the material supported in the cavity of the form to change the physical and, in certain instances, the chemical composition of such material. Certain features of the instant invention not found in the drawings which may or may not be described hereafter, such as apparatus for handling the reaction material or materials, form handling apparatus and the like, may be found my copending applications described and listed herein under Related Applications and reliance thereon is made for practicing the various embodiments of the invention which are not completely illustrated in the drawings and/or described herein. Where one or more lasers or electron guns are employed to generate high enough intensity radiation beams to perform the material reactions and transformations described, conventional high powered lasers or electron guns or necessary modifications thereof may be employed. Exact configurations of forms, cavities and other devices or components comprising the instant invention will depend on reaction material(s) being used, the quantities thereof employed in each cycle and the intensity of the radiation beam or beams employed in the reaction.

In FIG. 1 is shown a portion of an apparatus 10 including a form 11 made of metal or other suitable material and defining a base portion 11B containing one or more tapered open-topped cavities 12 formed in a surface of die 11. Disposed in cavity 12 is a predetermined quantity of particulate material 13 fed thereto by any suitable means which may completely or partially fill cavity 12 when it is fed thereto.

In FIG. 2, a second die form member 14 is shown brought into assembly with the member 11 and contains a base portion 15 with a tapered nose or protrusion 16 which extends into the cavity 12 in member 11 and is used to compress the particulate material 13 to a densified mass 13D within the cavity 12.

In FIG. 3, the member 14 has been removed from the location illustrated in FIG. 2 exposing the cavity 12 and densified mass of material 13D to a radiation beam 18 generated by a laser or electron gun 17 as pulse of such radiation when a control 20, such as a computer or programmer, generates an output signal causing the switch 19 to suddenly close and allowing electrical energy to be suddenly transmitted to or discharged through the operating input 17A of the laser or electron gun 17 thereby causing the latter to generate an intense pulse of radiation 18 which is directed against the mass 13D and, in so doing, rapidly heats and creates a shock wave in the compressed material 13D.

If the material 13 comprises particles of suitable carbon material and the intensity and duration of the pulse of radiation 18 is great enough, the heat and shock wave generated and transmitted through the densified material 13D will be sufficient to create one or more diamonds thereof. If materials other than carbon or a mixture of carbon particles with particles of other elements or compounds, are employed to partially fill the cavity 12, material other than diamond or composite materials including diamonds may be formed as described by subjecting the compressed mass thereof to such intense pulse or pulses of radiation directed into the cavity and against such compressed mass.

The apparatus illustrated in FIGS. 1–3 preferably includes a suitable support for form member 11 or a plurality of such members and automatically controlled means for relatively bringing members 11 and 14 together as shown in FIG. 2 and retracting and removing member 14 from member 11 or the latter from the former and locating member 11 or a support for the laser 17 in alignment with each other to permit the beam 18 of the laser to enter the cavity 12. Such machine components may be made in accordance with teachings found in my U.S. patent application Ser. No. 110,477 filed Jan. 8, 1980.

The apparatus illustrated in FIGS. 1–3 may also include a form member containing a plurality of cavities 12 machined or otherwise formed in one or more surfaces thereof which may be fabricated of suitable material adapted to resist destruction or damage caused by the shock waves and temperature transmitted thereto as the machine operates and the radiation beam pass into the cavity during each cycle. Member or members 11 may thus be supported by a suitable base such as a structural metal member defining a drum, rotary table or support, belt or flight of a belt conveyor, lineally operable device or the like. Suitable means, such as one of the types described or illustrated in said patent application Ser. No. 110,477, abandoned, may be provided for automatically filling the cavity 12 with particulate material to be processed and removing the processed material therefrom after it has been converted to diamond or other material by means of the heat and temperature generated when the intense radiation beam pulse or pulses intersect same as described.

In an alternate form of the invention, one or more intense pulses of radiation may be directed against a select portion of the member 11 or 14 or both, preferably in alignment with or against the tapered portion 16 thereof when the latter is compressively engaging the densified particulate material 13D in the cavity 12. A pulse of such intense radiation 18 directed against, for example, the bottom surface of a cavity/or passageway 14P extending through the base 15 of the member 14 from an opening at the upper end thereof, as illustrated in FIG. 4, and generated by a laser or electron gun supported by or above the member 14, may be utilized to both transfer its radiant heat energy to and generate a shockwave in the material of the member, which shock wave will be transmitted along the tapered portion 16 to the densified material 13D compressed by the tapered portion 16 in the cavity 12. Such heat and shock wave may effect a predetermined change in the material 13, such as by converting all or a portion of such material to diamond or other material or composite. Depending on the shape of the tapered portion 16 of the member, the shock wave generated when the pulse of radiation intersects the bottom wall of the bore or passageway 14P extending through the member 14 may be amplified as it reflects off the walls of the tapered portion 16 and may thus be substantially intensified by the time it reaches the bottom surface of the tapered portion 16 and is transmitted therefrom to the densified material 13D. Conversely, one or more bores or passageways extending through the member 11 may also be utilized to receive and transmit one or more pulses of intense radiation therethrough to the material of the member 11 in the immediate vicinity of the cavity 12 for generating one or more intense shock waves in the member 11 which are transmitted to the densified material 13D therein, with or without such materials being engaged and compressed by the tapered portion 16 of member 14. In the latter described machine configuration and operation, the shock wave applied to the material of member 11 may be utilized to both physically change such material and expel the material from the cavity 12.

In FIG. 4, a forming assembly 10A includes a first member 11 with a tapered cavity 12 formed in a surface thereof and containing a quantity of reaction material 13D compressed by a protruding portion 16 of a second member 14 which is in forced engagement with member 11 as illustrated. The base 15 of member 14 contains an elongated passageway 14P, such as a hole drilled therein from an upper surface (not shown) of the member 14 above which upper surface is disposed an electron gun or laser similar to the laser 17 of FIG. 3 which directs its intense pulsed radiation beam 18 through the hole or passageway 14P to the bottom row thereof which extends into the protruding portion 16 of member 14. If the beam 18 is generated at sufficient intensity, it will impart a shock wave to the member 14 in the vicinity of the surface which it intersects and such shock wave will travel along the protruding portion 16 to the end thereof and therefrom to and through the compressed pellet 13D of reaction material. If such reaction material comprises a pellet of carbon or graphite, and the shock wave generated and transmitted thereto through the solid protruding portion 16 is of sufficient intensity, at least a portion, if not all of such carbon material may be converted to diamond in the confined space between the member. It is noted that the material 13D has been greatly compacted and compressed to a highly densified state, as described, between the members 14 and 11 and is maintained in such compressed condition therebetween during the period one or more shock waves are transmitted thereto through the protruding portion 16.

In FIG. 5, an assembly 10B of forming members of the type described and denoted 11 and 14, is provided, wherein the member 11 contains an elongated passageway or bore 11P extending from a bottom surface thereof (not shown) through which passageway an intense radiation beam 18 is directed to the end wall thereof, which is disposed in direct alignment with the bottom wall of the cavity 12 of the member 11. A compressed pellet or disc 13D of reaction material, such as carbon, is compressed between the protruding portion 16 of member 14 and the bottom wall of the cavity 12, as illustrated, and receives one or more intense shock waves generated when the intense pulse of beam radiation 18 intersects the end wall of the passageway 11P, so as to provide intense heat within and force against the compressed material 13D of sufficient intensity to change such material to another form, such as diamond.

In FIG. 6, an assembly 21 of two female forming members 21A and 23 is provided, which members are separable from each other, permitting a small quantity 13D' to be removed from between the split members after having been reacted on by intense radiation of the type described. Forming member 23 of FIG. 6 is a transparent window preferably made of high temperature glass or ceramic material, which is disposed across the tapered cavity 22 formed between the two female members. A further member (not shown) is preferably in compressive engagement with the upper surface of window 23 with sufficient force to seal cavity during the reaction phase of the cycle. Two intense radiation beams 18A and 18B are illustrated as directed at an angle to each other through the window 23 into the tapered conical cavity 22 for simultaneously reacting on the small quantity of reaction material disposed in the bottom of such cavity and forming, for example, diamond or other material thereof in the manner described above. Additional radiation beams may also be directed into the cavity in a symmetrical array and focused within or against the upper surface of the pellet 13D' of reaction material to intensely heat and generate a shock wave or waves therein to effect the formation of diamond or other crystalline or non-crystalline material thereof.

It is noted that a high temperature glass or ceramic material may also form part of a male forming member, such as member 14 of FIGS. 2 and 5, or define the entire window 23, through which window intense beam or focused beam radiation of the type described may be directed against the compressed pellet of reaction material or carbon disposed between the members in the assemblies illustrated, rather than directing the laser beam through an open cavity as illustrated in FIG. 3.

As mentioned above, diamonds and other highly densified materials may be formed of pellets thereof which are directed into a reaction chamber from a supply thereof and, upon reaching a selected location within such chamber, may be intersected by two or more intense radiation beams, preferably although not necessarily simultaneously intersecting a single pellet at the center of the reaction chamber and operable to intensely heat and convert the pellet material to another form, such as diamond. In FIG. 7, such a reaction apparatus 30 is provided which includes a spherical reaction chamber 31, made of stainless steel or other suitable material and having secured to the outer surface of the spherical wall thereof, a plurality of devices including a plurality of lasers, three of which are shown in FIG. 7 and are denoted 37, 38 and 39. Openings or windows 33, 34 and 35 in the wall of the spherical chamber 31 permit intense beam radiation generated by the lasers 37, 38 and 39 respectively to pass therefrom into the reaction chamber. If the lasers are properly aligned, their respective radiation beams 18A, 18B and 18C may be directed along axes such that they will intersect at a predetermined location, such as the center of the spherical volume defined by the spherical chamber 31, and one or more particles or pellets of reaction material, such as carbon, may be supported within or directed to such central portion of the chamber to be simultaneously intersected and reacted on by the plurality of laser beams so as to impart extremely high temperature and the force of the shock waves generated in the pellet or particle by the beams which simultaneously intersect same. If the intense beams of radiation are pulsed and properly directed, each may generate its own shock wave within the pellet, which shock waves converge towards each other intensely compressing and heating the material of the pellet and such intense heat and force may be employed to form one or more diamonds of the material of the pellet.

Notation 40 refers to an elongated chamber disposed across and sealing an opening 32 in the wall of the spherical chamber 31. Located within chamber 40 is a supply of pellets or particles 44 of material to be reacted on and means, such as an electro-mechanical mechanism driven by a motor and operable for mechanically directing pellets, one at a time, into the chamber from the end of housing 40 or releasing a high velocity pressurized gas as a stream for carrying one or more pellets thereon into chamber 31 to the central location thereof defining the intersection of the axes of the beams of the lasers 37, 38 and 39.

The operation of the apparatus of FIG. 7 may be effected under the control of a master controller or computer wherein precise timing is employed to control the ejection of the pellet into the chamber and the simultaneous generation of the pulses of intense beam radiation by the lasers 37, 38 and 39. It is also noted that a single laser may be employed with the intense beam thereof split into three or more separate beams by suitable mirrors and other optical devices and directed by such devices through respective windows or openings in the chamber 31 to the described focal location thereof when the reaction material or pellet has reached such location. A feedback control system, of the type described in said parent application Ser. No. 110,477, abandoned, may be utilized in FIG. 7 and employing a photoelectric detector for detecting the pellet 44 when it reaches the focal location within the reaction chamber, which detector generates a control signal which controls the operation of the one or more lasers or electron guns directed their intense beam energy into the reaction chamber.

Also illustrated in FIG. 7 is an opening 36 in the bottom portion of the wall of the spherical reaction chamber 31 through which opening may fall material which has been reacted on by the intense radiation beams and may be collected in a tapered hopper 42 which is sealed to the wall of the chamber across the opening and fed therefrom, either individually or collectively, through a valve 43 to an exit duct or pipe 44.

In FIG. 8 is shown a modified form of pellet for use in a reaction chamber of the type illustrated in FIG. 7 or a modified form thereof. The pellet 45 includes a core portion 46 of reaction material, such as carbon or other material to be converted by high temperature and shock waves, to diamond or other material. Completely surrounding and forming a shell on the outer surface of the spherical pellet 46 is a coating of frozen tritium-deuterium which is capable of partaking in a thermonuclear fusion reaction when intersected from a plurality of directions by a plurality of intense laser beams. The resulting fusion reaction generates intense heat and pressure which is applied to the core material 46 and is operable to transform or change such material to another form, such as diamond or diamonds. A plurality of pellets 45 of the type illustrated in FIG. 8 may be individually fed in sequence to a reaction chamber of the type shown in FIG. 7 and each simultaneously intersected by a plurality of intense pulsed radiation beams for effecting thermonuclear fusion of the fusion material 47 surrounding the core 46 of the composite pellet.

Depending on the reaction material employed, the intensity of the radiation beam or beams employed and the physical change(s) desired in the material(s) reacted on, the quantity of the carbon or other reaction material employed in pellet or particle form charged into the forming members or cavity may vary from an order of a few milligrams to one or more grams thereof and the shell of thermonuclear fusion material, such as frozen tritium-deuterium, may also vary from milligram to gram quantities. The described reaction may take place in a cavity or plural cavities or in the reaction chamber in a vacuum or predetermined atmosphere such as a vapor or gaseous atmosphere, which may or may not partake in the reaction at atmospheric or high ambient pressure.

Additional variations in the machinery described above include the following:

1. Control 20 for the laser or electron beam 17 may comprise a computer or programming device which is also operable to control apparatus for filling cavity or cavities 12 of the forming member 11 with particulate material to be processed, relative movement between member 11 and 14 and an apparatus for removing processed material from one or more cavities 12 formed in member 11 or a plurality of such members supported by a common base.

2. Particles of material to be combined with the material in the member 12 may be introduced into the cavity or beam 18 as it is directed into the cavity and implanted, welded or otherwise combined with the material in the cavity by means of the heat and shock wave force applied thereto.

3. If the member 14 is replaced by a machine component or other article, the densified material 13D may not only be physically changed in structure but may also be bonded or welded to the surface of portion 16 which engages same, by means of the intense heat generated when the intense radiation beam is directed through the passageway 14P extending to the vicinity of the portion 16 illustrated, for example, in FIG. 4. Cutting tools, dies and other composite devices may be fabricated by such means. It is also noted that the material in the member may be welded to the base of the cavity 12 and retained therein by the means illustrated in FIG. 3. Such retention may be such as to provide a composite article, such as a die or other device formed of the processed material and at least a portion of the member 11 or may be retained only for further processing in the cavity after which it is removed. In the embodiment in which the heat material is welded to the end of protruding member 16, such welding may be utilized only to remove the material from the cavity when the member 14 is separated from member 11, whereafter the material may be removed from the end of portion 16 or retained thereon for further processing.

4. In a modified form of the apparatus 10A shown in FIG. 4, the nose or tapered portion 16 of the tool or die member 14 may serve to compress, heat, react on and bond the material 13D to member 11, which, although it acts as a forming member, may also comprise a unit of work to be formed into a composite material with the material compressed thereagainst and reacted on as described above. Such bonding may be effected by the force and heat of the shock wave generated by the radiation beam 18 generated in the material of the tapered portion 16 and/or by means of heat transferred from the radiation beam to the material of portion 16 and conducted therethrough to the material 13D. Similarly, one or more shock waves and/or heat generated by one or more pulses of radiant energy defined by beam 18 of FIG. 5 may also be employed to react on, change and weld or bond material 13D thereof to either member 11 or member 14.

5. As indicated above, the nose or tapered portion 16 of the tool or die 14 may form part of a cutting tool, such as a cutting edge defining portion thereof which is heated by means of the beam of radiation directed thereto along passageway 14P, wherein such heating is employed to heat the material of the work engaged by such tool, for the purpose of improving the operation of the tool and/or reacting on the material being cut. For example, if the tool is a surgical tool employed to cut tissue in a surgical operation, the heat applied by means of beam 18 of FIG. 4 to the surgical tool cutting blade or operating portion 16 may be employed to cauterize or otherwise beneficially affect the cut or injured tissue.

6. If the tapered portion 16 of the tool 14 of FIG. 4 defines one or more cutting edges of a cutting tool or a support to hard material 13D, such as diamond or other hard solid matter, bonded or welded thereto, which hard material defines one or more cutting edges, then the cutting edge portion or portions thereof may be heated, as described, by means of radiant energy transferred through the passageway 14P as a narrow beam of laser or electron radiation, so as to improve the cutting action by heating the material being cut or to cauterize living tissue cut by the cutting tool.

7. A material processing device made in accordance with the structures and teachings of FIGS. 4 and 5 may be used to primarily compress and/or heat matter adjacent a select portion of such device for the purpose of both physically and chemically changing such matter in a predetermined manner as a result of the heat transferred, as described above, to such matter or a combination of heat and one or more shock waves generated and conducted through the device or tool.

8. If the nose or tip portion 16 of the embodiment of FIG. 4 is shaped with a cutting edge, such cutting edge portion may be rapidly heated by the beam 18 of radiation directed through passageway 14P to the vicinity of the cutting edge portion of the tool by conduction. Such heat may then be passed from the cutting edge portion of the tool to work matter which it is cutting to soften or otherwise controllably affect same in a cooperative action with the tool.

9. The tool 14 may also be modified in shape and may comprise either the operating head of a catheter or a portion thereof operable to transfer shock waves and/or radiant energy in the form of heat to matter adjacent thereto when the catheter is disposed in a body duct or tissue. The heat transferred may be used to coagulate blood. Shock waves so generated and passed through such operating head as described may be employed to dissipate or break up blood clots and/or other solid matter constricting a blood vessel or other body duct in which the catheter is disposed or in an adjacent body duct.

10. In addition to solid material or particles disposed to be operated on by the direct and/or indirect effects of the radiation beam or beams of FIGS. 3–7, matter which is subjected to the heat and shock waves generated as described may also be in liquid and/or gaseous state disposed in or adjacent the forming member or members or chamber 31.

11. Particles of carbon, such as carbon atoms derived from hydrocarbon molecules of a gas or vapor by stripping same from the molecules with intense radiant energy which serves to break the bonds between the atoms of the molecules, may also be deposited and formed as synthetic diamond material on a substrate such as select portion or portions of a support for a tool or die as described. Such intense radiation may be generated as a beam or beams of a high powered laser, such as an excimer or carbon dioxide laser, a microwave energy generator or a plurality of same located and operable to generate and direct radiation against the carbon particles or atoms disposed against the surface on which such carbon is formed into synthetic diamond.

12. A combination of beamed laser and microwave radiation may be employed to form and deposit atoms of carbon as a layer or layers of synthetic diamond on a substrate from molecules containing such carbon atoms or to heat and form small solid particles of carbon into synthetic diamond on a substrate and to effect the heating of such substrate in a manner to fusion weld or bond such synthetic diamond as a layer to the surface of the substrate as it is formed thereon. If the substrate is made of a metal such as tool steelmetal alloy or contains a coating of metal or alloy on the portion thereof against which the synthetic diamond layer is formed, the surface stratum thereof may be rendered molten by such radiation, which is employed to deposit and/or form the carbon particles into the synthetic diamond layer. When the molten layer cools and solidifies, a fusion bond is effected with the synthetic diamond material which is similar to a weld.

What is claimed is:

1. A method for forming artificial diamonds comprising:
   (a) placing in contact with each other a quantity of non-diamond material in solid phase, which material is at least partially comprised of the element carbon, and a solid support;
   (b) generating a laser beam; and
   (c) aiming said laser beam at said carbonaceous material to heat said material sufficiently to convert said material to synthetic diamond.

2. A method in accordance with claim 1, wherein (c) includes effecting the fusion bonding of said synthetic diamond to a surface of said support as said synthetic diamond is formed against said support 3. A method in accordance with claim 1 wherein (a) comprises placing in contact with each other said solid, carbonaceous, non-diamond material and select portions of said support.

4. A method in accordance with claim 3 further comprising defining said select portions of said support so as to cause said converted synthetic diamond to define a cutting edge.

5. A method in accordance with claim 1 wherein (a) comprises disposing said solid, carbonaceous, non-diamond material against the inside of a support shaped as a shell.

6. A method in accordance with claim 5 wherein (c) further includes consuming said shell.

7. A method in accordance with claim 1 wherein (c) includes directing said laser beam into a reaction chamber enclosing said non-diamond material and said solid support, and further comprising controlling the atmosphere in said reaction chamber.

8. A method in accordance with claim 7 wherein (a) includes disposing said support and said solid, carbonaceous, non-diamond material at a selected location in said reaction chamber.

9. A method in accordance with claim 7 wherein (a) includes directing said solid, carbonaceous, non-diamond material to a selected location in said reaction chamber.

10. A method in accordance with claim 1 wherein (a) comprises disposing a multitude of carbon-containing particles against said support.

11. A method in accordance with claim 10 further comprising compressing said multitude of particles before act (c) is performed.

12. A method in accordance with claim 11 wherein (c) includes causing said multitude of particles to fuse together.

13. A method in accordance with claim 12 wherein (a) further comprises disposing against said support a multitude of particles of a second material and wherein (c) includes causing both multitudes of particles to fuse together and to the support.

14. A method in accordance with claim 11 wherein (b) includes applying said energy to generate a shock wave.

15. A method in accordance with claim 1 wherein (b) includes generating a laser beam of a visible-light wavelength.

16. A method in accordance with claim 15 further comprising generating a second beam of radiant energy and directing it at said carbonaceous material to cooperate with the first laser beam in forming synthetic diamond.

17. A method in accordance with claim 15 further comprising introducing a second material into said beam, which second material is carried along said beam to interact with said carbonaceous material.

18. A method in accordance with claim 1 further comprising carrying out said sequence of acts under the control of a computer.

19. A method for forming a diamond-coated tool element comprising:
(a) disposing against a select portion of a solid support defining a selected shape a first multitude of particles of a non-diamond material in solid phase, which particles are at least partially comprised of the element carbon, and a second multitude of particles of a second material also in solid phase;
(b) generating a beam of intense, radiant, electromagnetic energy; and
(c) compressing said first and second multitudes of particles and directing said beam at said particles, to heat said multitude of particles of carbonaceous particles, to convert said heated material to synthetic diamond, and to cause the heated material to fuse together and to form a layer integrated with a surface of said support and located so as to form at least a selected part of a tool.

20. A method in accordance with claim 19 wherein (b) includes generating radiant energy using a laser.

21. A method for forming artificial diamonds comprising:
(a) disposing a quantity of non-diamond material in solid phase, which material is at least partially comprised of the element carbon, inside a solid support shaped as a shell;
(b) directing said shell containing said carbonaceous material to a selected location in a reaction chamber having a controlled atmosphere;
(c) generating from a plurality of directions beams of intense radiant energy;
(d) causing said beams to strike said shell when the shell reaches said selected location to vaporize said shell and to convert the carbonaceous material contained in said shell to synthetic diamond; and
(e) repeating (a) through (d) a plurality of times under the control of a computer.

22. A method in accordance with claim 21 wherein (b) includes generating radiant energy in the form of a beam of electrons.

23. A method in accordance with claim 21 wherein (c) includes generating radiant energy with a plurality of laser beams.

24. A method for forming artificial diamonds comprising:
(a) placing in contact with each other a quantity of non-diamond material in solid phase, which material is at least partially comprised of the element carbon, and a solid support;
(b) generating an electron beam; and
(c) aiming said electron beam at said carbonaceous material to heat said material sufficiently to convert said material to synthetic diamond.

25. A method in accordance with claim 24 wherein (c) includes effecting the fusion bonding of said synthetic diamond to a surface of said support as said synthetic diamond is formed against said support.

26. A method in accordance with claim 25 wherein (a) comprises placing in contact with each other said solid, carbonaceous, non-diamond material and select portions of said support, and further comprising defining said select portions of said support so as to cause said converted synthetic diamond to define a cutting edge.

27. A method in accordance with claim 24 wherein (a) comprises disposing a multitude of carbon-containing particles against said support.

28. A method in accordance with claim 24 further comprising generating a second beam of radiant energy and directing it at said carbonaceous material to cooperate with the first electron beam in forming synthetic diamond.

29. A method in accordance with claim 2 further comprising carrying out said sequence of acts under the control of a computer.

* * * * *